(12) United States Patent
Gaucher et al.

(10) Patent No.: US 7,119,745 B2
(45) Date of Patent: Oct. 10, 2006

(54) APPARATUS AND METHOD FOR CONSTRUCTING AND PACKAGING PRINTED ANTENNA DEVICES

(75) Inventors: Brian Paul Gaucher, Brookfield, CT (US); Duixian Liu, Yorktown Heights, NY (US); Ullrich Richard Rudolf Pfeiffer, Carmel, NY (US); Thomas Martin Zwick, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 10/881,104

(22) Filed: Jun. 30, 2004

(65) Prior Publication Data

US 2006/0001572 A1 Jan. 5, 2006

(51) Int. Cl.
*H01Q 1/38* (2006.01)
(52) U.S. Cl. .............................. 343/700 MS; 343/846
(58) Field of Classification Search ......... 343/700 MS, 343/830, 846, 702, 720, 793, 803, 873
See application file for complete search history.

(56) References Cited

U.S. PATENT DOCUMENTS

| | | | | |
|---|---|---|---|---|
| 4,539,567 A | * | 9/1985 | Brewer | 342/351 |
| 4,623,893 A | * | 11/1986 | Sabban | 343/700 MS |
| 4,691,206 A | | 9/1987 | Shapter et al. | 343/700 |
| 5,208,602 A | | 5/1993 | Monser et al. | 343/795 |
| 5,210,542 A | * | 5/1993 | Pett et al. | 343/700 MS |
| 5,777,583 A | | 7/1998 | Canora et al. | 343/700 |
| 5,870,057 A | | 2/1999 | Evans et al. | 343/700 |
| 5,886,669 A | * | 3/1999 | Kita | 343/718 |
| 5,903,239 A | | 5/1999 | Takahashi et al. | 343/700 |
| 6,087,989 A | | 7/2000 | Song et al. | 343/700 |
| 6,218,989 B1 | | 4/2001 | Schneider et al. | 343/700 |
| 6,518,930 B1 | | 2/2003 | Itoh et al. | 343/767 |
| 6,593,894 B1 | | 7/2003 | Biswas et al. | 343/793 |

OTHER PUBLICATIONS

R. Afzalzadeh et al., *X-Band Directive Single Microstrip Patch Antenna using Dielectric Parasite*, Electronics Letters, Jan. 2, 1992, vol. 28, No. 1, pp. 17-19.
Nicolaos G. Alexopoulos, *Fundmental Superstrate (Cover) Effects on Printed Circuit Antennas*, IEEE Transactions on Antennas and Propagation, vol. AP-32, No. 8, Aug. 1984, pp. 807-816.
Inder J. Bahl, et al., *Design of Microstrip Antennas Covered with a Dielectric Layer*, IEEE Transactions on Antennas and Propagation, vol. AP-30, No. 2, Mar. 1982, pp. 314-318.
*Effects of Dielectric Superstrate on Patch Antennas*, Electronics Letters, vol. 24, No. 6, Mar. 17, 1988, pp. 356-358.

(Continued)

*Primary Examiner*—Michael C. Wimer
(74) *Attorney, Agent, or Firm*—F. Chau & Associates, LLC; Frank V. DeRosa (57) ABSTRACT

Printed antenna devices are provided, which can operate at RF and microwave frequencies, for example, while simultaneously providing antenna performance characteristics such as high gain/directivity/radiation efficiency, high bandwidth, hemispherical radiation patterns, impedance, etc., that render the antennas suitable for voice communication, data communication or radar applications, for example. Further, apparatus are provided for integrally packaging such printed antenna devices with IC (integrated circuit) chips (e.g., transceiver) to construct IC packages for, e.g., wireless communications applications.

12 Claims, 6 Drawing Sheets

OTHER PUBLICATIONS

C.R. Brewitt-Taylor, *Planar Antennas on a Dielectric Surface*, Electronics Letters, vol. 17, 1981, pp. 729-730.

Wonkyu Choi et al., *High Gain and Broadband Microstrip Patch Antenna using a Superstrate Layer*, IEEE, 2003, pp. 292-295.

M.M. Faiz et al., *A High Efficiency L-Band Microstrip Antenna*, IEEE, 1999, pp. 272-275.

Chih-Yu Huang, et al., *Compact Microstrip Antenna Loaded with Very High Permittivity Superstrate*, IEEE, 1998, pp. 680-683.

David R. Jackson et al., *Gain Enhancement Methods for Printed Circuit Antennas*, IEEE Transactions on Antennas and Propagation, vol. AP-33, No. 9, Sep. 1985, pp. 976-987.

R.Q. Lee et al., *Effects of Dielectric Superstrates on a Two-Layer Electromagnetically Coupled Patch Antenna*, IEEE, 1989, pp. 620-623.

P. Lowes, et al., *Performance of Microstrip Patch Antenna with Electrically Thick Laminated Glass Superstrate*, Electronics Letters, vol. 30, No. 23, Nov. 10, 1994, pp. 1903-1905.

K.M. Luk et al., *Microstrip Antennas Covered with Dielectric Materials*, IEEE, 1989, pp. 616-619.

Vladimir Rolansky et al., *Manufacturing Tolerances Impact on Millimeter Wave Enhanced Gain Patch Antenna Performance*, IEEE, 1998, pp. 1348-1351.

Reuven Shavit, *Dielectric Cover Effect on Rectangular Microstrip Antenna Array*, IEEE Transactions on Antennas and Propagation, vol. 42, No. 8, Aug. 1994, pp. 1180-1184.

X.-H Shen, et al., *Effect of Superstrate on Radiated Field of Probe Fed Microstrip Patch Antenna*, IEE Proc.-Microw. Antennas Propag., vol. 148, No. 3, Jun. 2001, pp. 141-146.

A.K. Verma, *Input Impedance of Rectangular Microstrip Patch Antenna with Iso/Anisopropic Substrate-Superstrate*, IEEE Microwave and Wireless Components Letters, vol. 11, No. 11, Nov. 2001, pp. 456-458.

Lei Zhu et al., *Spectral Domain Analysis of Circularly Polarized Rectangular Patch Antennas with a Dielectric Superstrate*, IEEE, 1996, pp. 408-411.

Lei Zhu, et al., *Characterization of Microstrip Patch Antennas Suspended by a Dielectric Superstrate with High Permittivity*, IEEE, 1996, pp. 704-707.

* cited by examiner (Prior Art)
FIG. 1

FIG. 3B vertical radiation pattern at Ψ = 90° (co-pol)

APPARATUS AND METHOD FOR CONSTRUCTING AND PACKAGING PRINTED ANTENNA DEVICES

TECHNICAL FIELD OF THE INVENTION

The present invention relates generally to antennas for wireless or RF (radio frequency) communications systems and, more specifically, printed antenna designs that provide both high bandwidth and efficiency with substantially hemispherical radiation patterns, as well as apparatus and methods for packaging such antennas with IC (integrated circuit) chips.

BACKGROUND

To provide wireless connectivity and communication between devices in a wireless network such as a wireless PAN (personal area network), a wireless LAN (local area network) a wireless WAN (wide area network), a cellular network, or virtually any radio network or system), it is necessary to equip the receivers and transmitters (or tranceivers) with antennas to efficiently radiate (transmit) or receiver the desired signals to/from other elements of the network.

Figure 1:
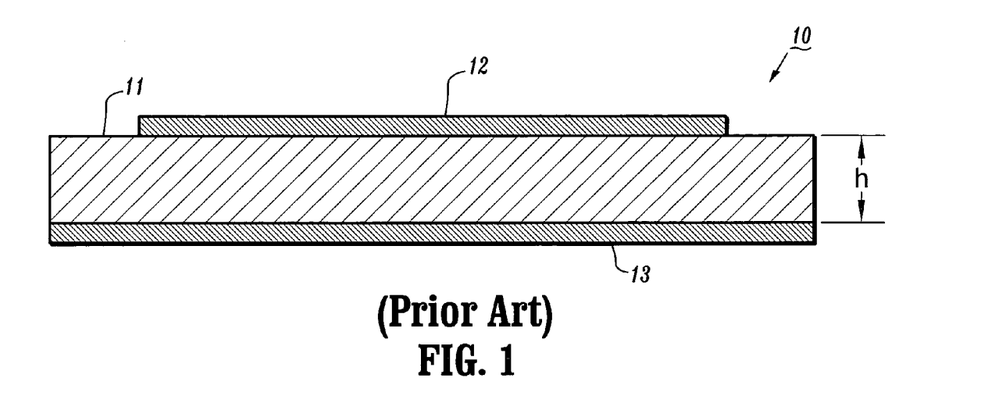
FIG. 1 is a schematic diagram illustrating an conventional printed antenna design.

Various types of antennas may be implemented in such communications networks and devices including, for example, a conventional printed circuit antenna as shown in FIG. 1. More specifically, FIG. 1 depicts a conventional planar circuit board antenna (10) comprising a planar dielectric substrate (11) (or circuit board) having a printed antenna (12) over a ground plane (13) at a distance h, wherein the printed antenna (12) and ground plane (13) are formed on opposite sides of the dielectric substrate (11). An antenna framework as depicted in FIG. 1 with a printed antenna on a dielectric substrate/circuit board with a reflecting ground plane below is typically used for applications in which it is desirable to limit the antenna radiation to the upper hemisphere above the antenna (10).

SUMMARY OF THE INVENTION

One significant disadvantage of a conventional printed antenna device having a framework as shown in FIG. 1 is that such design provides a limit on the bandwidth-efficiency product that can be achieved. Indeed, a higher bandwidth can typically be achieved only at the cost of efficiency. The antenna "efficiency" is a measure of the relation between the power radiated by an antenna and the power input to the antenna (a lossless antenna provides 100% efficiency). Antenna efficiency will decrease due to resistive losses and impedance mismatches.

Furthermore, another parameter that influences the bandwidth-efficiency product is the dielectric constant of the substrate material. The use of a substrate material having a lower dielectric constant leads to a higher bandwidth-efficiency product. Accordingly, PTFE-based substrates, which provide the lowest available dielectric constant for a substrate material of 2.1, are typically used for printed antenna designs such as in FIG. 1, because they provide good bandwidth-efficiency product designs, e.g., 10% bandwidth at 80% efficiency.

However, the tolerances of the etching technology that is used for generating feed and antenna patterns on a PTFE-based substrates together with via capabilities are not meeting the requirements if the antenna is desired to be connected to a MMW (millimeter wave) IC via C4 balls. Indeed, currently available metal deposition methods (thin film technology) that provide sufficient tolerances cannot be applied to PTFE-based materials. Therefore, when printed antennas having the conventional framework of FIG. 1 are designed for operating at MMW frequencies and to be connected to an IC via C4 balls, substrate materials with higher dielectric constants are required, thereby leading to antennas with smaller bandwidth-efficiency products. Additionally the bandwidth-efficiency product resulting from the use of a PTFE-based substrate is not sufficient for all applications.

In general, exemplary embodiments of the invention generally include printed antenna devices that can operate at RF and microwave frequencies, for example, while simultaneously providing good antenna performance characteristics such as high gain/directivity/radiation efficiency, high bandwidth, hemispherical radiation patterns, impedance, etc., which render such antennas suitable for voice communication, data communication or radar applications, for example.

More specifically, in one exemplary embodiment of the invention, an antenna device comprises a planar substrate, an antenna pattern formed on a first surface of the planar substrate, and a ground plane that is disposed substantially parallel to, and displaced from, the first surface of the planar substrate and facing the antenna pattern. The antenna pattern may comprises one of various types of antennas that can be printed on a planar substrate including, but not limited to, patch antennas (e.g., coplanar patch), dipole antennas, folded dipole antennas, monopole antennas, ring antennas, loop antennas, etc., Moreover, with the exemplary antenna embodiment, a space between the ground plane and planar substrate can be filled with air or a low dielectric material such as foam.

In another exemplary embodiment of the invention, the antenna device may include an antenna feed network formed on the first surface of the planar substrate. The antenna feed network may include an impedance matching network.

In yet another exemplary embodiment of the invention, the antenna includes a beamshaping pattern formed on first surface of the planar substrate, a second surface opposite the first surface of the planar substrate, or both the first surface and second surface of the planar substrate, to reduce radiation in a direction along the plane of the planar substrate and/or to enhance a hemispherical radiation pattern of the antenna (i.e., enhance directivity of the antenna).

Exemplary embodiments of the invention further include apparatus and methods for integrally packaging printed antenna devices according to the invention with IC (integrated circuit) chips (e.g., transceiver) to construct IC packages for, e.g., wireless communications applications. In particular, printed antenna devices according to embodiments of the invention can efficiently operate with relatively small ground planes, which enables compact packaging of such antennas with IC chips (e.g., a transceiver IC chip, a receiver or transmitter chip, and/or other IC chips) in a relatively small package similar in size to that of existing leaded carriers or leadless chip carriers for, e.g., transceiver ICs.

More specifically, in one exemplary embodiment of the invention, an IC (integrated circuit) package device comprises: a package substrate having a ground plane formed on a surface thereof; an IC chip bonded to the surface of the package substrate; a planar substrate comprising an antenna pattern formed on a first surface of the planar substrate, wherein the planar substrate is flip-chip bonded to the IC chip such that the antenna pattern faces toward the ground plane of the package substrate and the first surface of the planar substrate is disposed substantially parallel to, and displaced from, the ground plane of the package substrate; and a package cover formed over the package base substrate to encapsulate the IC chip and planar substrate, wherein the package cover comprises an opening that exposes a portion of a second surface of the planar substrate opposite a portion of the first surface of the planar substrate having the antenna pattern.

These and other exemplary embodiments, aspects, objects, features and advantages of the present invention will be described or become apparent from the following detailed description of exemplary embodiments, which is to be read in connection with the accompanying drawings.

DETAILED DESCRIPTION OF EXEMPLARY EMBODIMENTS

Exemplary embodiments of the invention generally include printed antenna devices that can operate at RF and microwave frequencies, for example, while simultaneously providing antenna performance characteristics such as high gain/directivity/radiation efficiency, high bandwidth, hemispherical radiation patterns, impedance, etc., that render the antennas suitable for voice communication, data communication or RADAR applications, for example. Exemplary embodiments of the invention further include apparatus and methods for integrally packaging printed antenna devices according to the invention with IC (integrated circuit) chips (e.g., transceiver) to construct IC packages for, e.g., wireless communications applications. In particular, printed antenna devices according to embodiments of the invention can efficiently operate with relatively small ground planes, which enables compact packaging of such antennas with IC chips (e.g., transceiver IC chip) in a relatively small package similar in size to that of existing leaded carriers or leadless chip carriers for, e.g., transceiver ICs. Indeed, by way of example, antennas according to the invention which are designed to operate at resonant frequencies of about 20 GHz or greater are sufficiently small to be packages with such existing IC chips.

Figure 2:
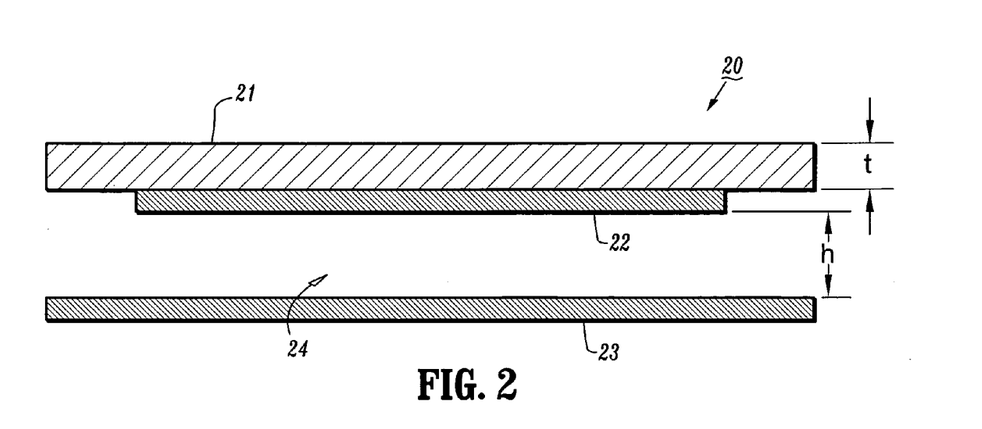
FIG. 2 is a schematic diagram illustrating a printed antenna device according to an exemplary embodiment of the invention.

Referring now to FIG. 2, a schematic diagram illustrates an antenna device according to an exemplary embodiment of the present invention. In particular, FIG. 2 is a cross-sectional schematic view of a printed antenna device (20) according to an exemplary embodiment comprising a planar substrate (21) of thickness (t), a printed antenna circuit (22) (and feed network) formed on a surface of the substrate (21) and a planar metallic ground plane (23). The planar metallic ground plane (23) is disposed substantially parallel to planar substrate (21) facing the antenna pattern (22). The ground plane (23) is positioned at a distance (h) from the surface of the printed antenna (22), thereby forming a space (24) (or cavity) between the ground plane (23) and surface of the substrate (21) on which the printed antenna (22) is formed. In one exemplary embodiment, the space/cavity (24) can be filled with air (dielectric constant=1). In another exemplary embodiment, the space/cavity can be filled with a foam material having a relatively low dielectric constant close to that of air (e.g., dielectric constant=1.1).

Figure 7A:
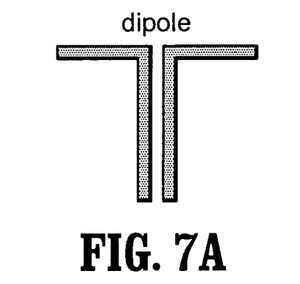
FIGS. 7A~7F are schematic illustrations of various planar antennas that can be implemented for an antenna framework as depicted in FIG. 2 according to exemplary embodiments of the invention.
Figure 7B:
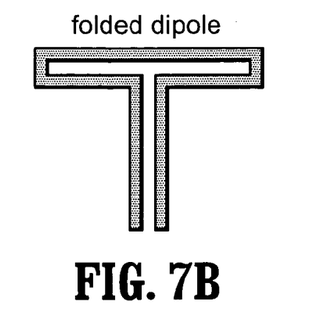
Figure 7C:
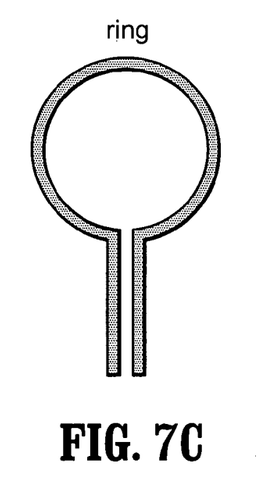
Figure 7D:
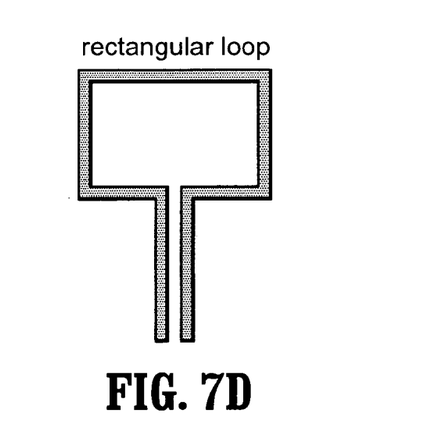
Figure 7E:
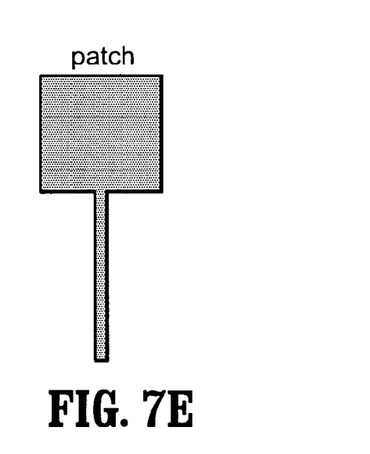
Figure 7F:
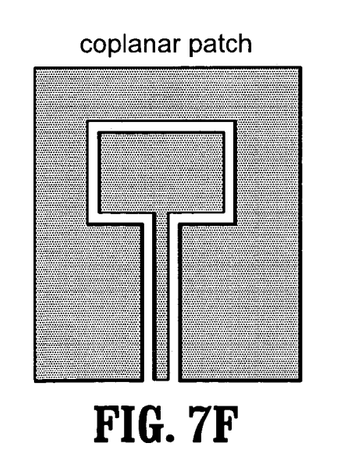

Depending on the intended application and/or frequency of operation, the printed antenna (22) may comprise one or more of various types of printed planar antennas including, for example, a dipole antenna (FIG. 7A), a folded dipole antenna (FIG. 7B), a ring antenna (FIG. 7C), a rectangular loop antenna (FIG. 7D), a patch antenna (FIG. 7E), a coplanar patch antenna (FIG. 7F), monopole antennas, etc., as well one or more of various types of antenna feed and/or impedance matching networks, such as balanced differential lines, coplanar lines, etc.

In addition, the substrate (21) may comprise any suitable material including, for example, dielectric or insulative materials such as fused silica ($SiO_2$), alumina, polystyrene, ceramic, teflon based substrates, FR4, etc., or semiconductor materials such as high resistivity silicon or GaAs, etc., depending on the antenna implementation. In general, the printed antenna (22) (and optional feed networks) may be formed by depositing and patterning a thin film conductive material such as copper or gold, for example, using methods known to those of ordinary skill in the art. In this regard, an exemplary antenna device (20) according to the invention maintains the benefits of conventional printed circuits depicted in FIG. 1 as described above, but further enable more efficient construction and operation for high-frequency (e.g., millimeter wave) operation as compared to such conventional printed circuits. Indeed, in contrast to the an exemplary antenna design of FIG. 1, the exemplary antenna framework of FIG. 2 provides both high bandwidth and high efficiency at the same time, which is the result of various factors such as the antenna (20) having a very low dielectric "substrate" (e.g., air cavity (24)) between the printed antenna (22) and ground (23), and the antenna (20) having a high dielectric (21) material above the printed antenna (22). Moreover, with such antenna design, because much of the electric field will be concentrated in the higher dielectric (21) (e.g., higher dielectric than air "substrate" (24)) above the printed antenna (22) structure, such antenna design provides very good directivity.

For illustrative purposes, exemplary embodiments of the invention will be described with particular reference to printed folded dipole antenna devices and integration of such devices in semiconductor IC packages. It is to be understood, however, that the present invention is not limited to any particular antenna type or operating frequency. Instead, the invention is more generally applicable to any antenna type that is suitable for a given application and/or frequency of operation to provide a high bandwidth and efficiency product antenna.

Figure 3A:
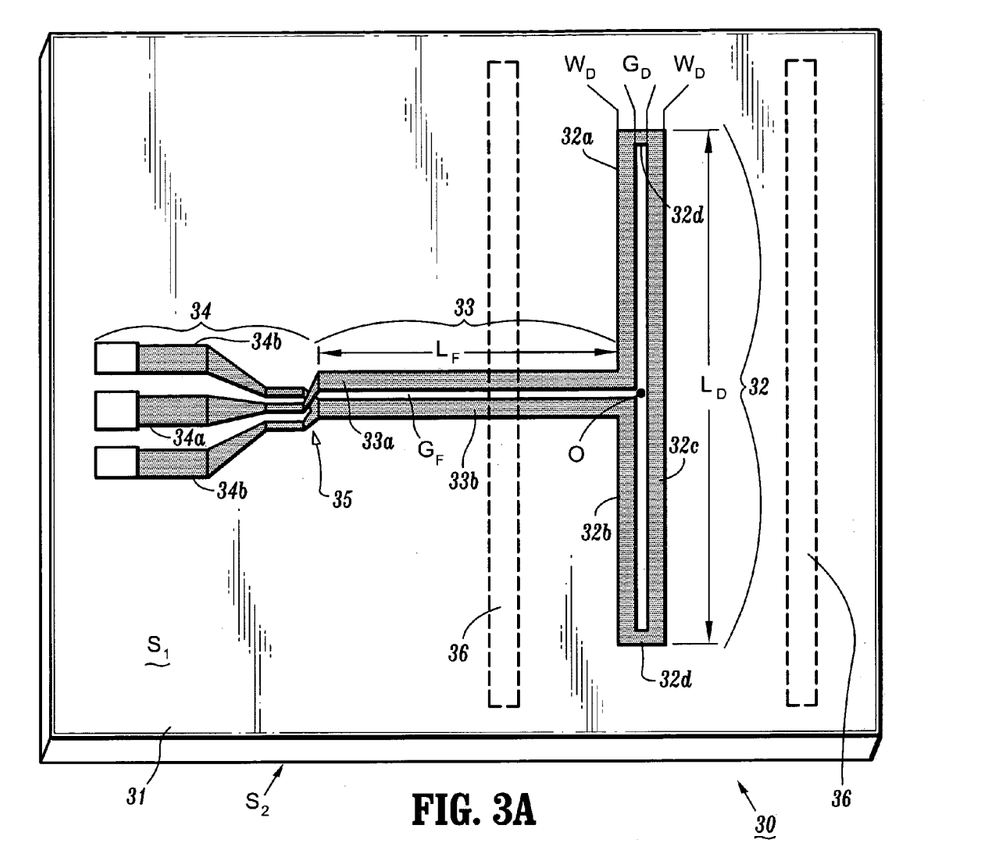
FIG. 3A is a schematic diagram illustrating an exemplary prototype antenna device comprising a printed folded dipole antenna and feed network according to an exemplary embodiment of the invention.

For example, FIG. 3A is a schematic diagram illustrating an exemplary antenna device comprising a printed folded dipole antenna and feed network according to an exemplary embodiment of the invention. In general, FIG. 3A schematically depicts a printed antenna device (30) comprising a planar dielectric substrate (31), a printed folded dipole antenna (32), and a feed network comprising a balanced differential line (33) connected to a finite ground coplanar line (34) via a balun (35). The printed folded dipole antenna (32) and a feed network (33, 34 and 35) are formed on one surface ($S_1$) of substrate (31).

In another exemplary embodiment, the antenna (30) further optionally comprises a pair of metal bars (36) (shown in phantom) formed on a substrate surface ($S_2$) which is opposite the surface ($S_1$) on which the antenna (32) and feed network (33, 34, 35) are formed. The metal bars (36) are used for limiting the effect of surface/substrate waves that propagate in the direction along the plane of the antenna substrate (31) and provide more gain in the desired direction. In this regard, the metal bars (36) can be generally considered as a "beamshaping" or "beamshaping enhancement" pattern that suppress radiation or wave propagation in the direction parallel to the substrate (31) and increase radiation or wave propagation in the desired direction (e.g., perpendicular to the substrate (31)).

In the exemplary embodiment of FIG. 3A, the metal (beamshaping) bars (36) are placed parallel to the folded dipole (32) on the opposite side ($S_2$) of the substrate (31) at a distance of approximately ½ wavelength (free space) away from the folded dipole antenna (32). It is to be understood, however, that the metal bars (36) can be placed on the either side ($S_1$ or $S_2$) of the substrate (31), or on both sides ($S_1$ and $S_2$) of the substrate (30), to effectively suppress surface/substrate wave propagation and enhance directivity of the antenna. The exemplary metal bars (36) in FIG. 3A are suitable for use with the exemplary folded dipole antenna design (or a dipole design). It is to be appreciated that the type of beamshaping pattern (or other mechanism) that can be used to suppress surface/substrate wave propagation will vary depending on the type of printed antenna design.

The differential feed line (33) comprises two parallel feed lines (33a, 33b) of length, $L_F$, that are separated by a gap, $G_F$, and formed in the same plane (i.e., on the same surface of the substrate (31)). The gap $G_F$ between the feed lines (33a) and (33b) results in the formation of a balanced, edge-coupled stripline transmission line.

The coplanar line (34) comprises a signal feed line (34a) formed between two ground lines (34b). The signal feed line (34a) of the coplanar line (34) is connected via the balun (35) to the feed line (33a) of the balanced differential line (33). The two ground lines (34b) of the coplanar line (34) are connected via the balun (35) to the other feed line (33b) of the balanced differential line (33). In one exemplary embodiment, the differential line (33) is designed to have an intrinsic impedance that can match the impedance of the folded dipole antenna (32) to the impedance of the coplanar line (34). The impedance of the differential line (33) can be adjusted by, e.g., varying the width of the feed lines (33a, 33b) and the size of the gap $G_F$ between the feed lines (33a, 33b) as is understood by those of ordinary skill in the art.

In the exemplary embodiment of FIG. 3A, the folded dipole antenna (32) comprises a first (fed) half-wavelength dipole element comprising first and second quarter-wave elements (32a) and (32b) and a second half-wavelength dipole element (32c), which are disposed parallel to each other and separated by a gap, $G_D$. The gap $G_F$ of the differential line (33) separates the first half-wavelength dipole element into the first and second quarter-wavelength elements (32a) and (32b). The end portions of elements (32a) and (32b) are connected (shorted) to end portions of the second dipole element (32c) by elements (32d). The folded dipole antenna (32) has a length, denoted as $L_D$, and a width denoted as $W_D$.

The parameter $L_D$ of the folded dipole antenna (32) will vary depending on the frequency of operation and the dielectric constant of the substrate (31), for example. Moreover, the feed network framework will vary depending on, e.g., the impedance that is desired for the given application and/or the type of devices to which the antenna will be connected. For example, if the antenna is connected to a transmitter system, the feed network will be designed to provide the proper connections and impedance matching for a power amplifier. By way of further example, if the antenna is connected to a receiver system, the feed network will be designed to provide the proper connections and impedance matching for a LNA (low noise amplifier).

For purposes of testing and determining electrical properties and characteristics of a printed antenna design according to the invention, prototype antennas were constructed using various frameworks similar to that depicted in FIG. 3A for folded dipole antenna device with and without the metal (beamshaping bars) In particular, a prototype antenna was built comprising a 60 GHz folded dipole antenna and feed network (as depicted in FIG. 3A) (with and without the bars) formed on a fused silica (SiO2) dielectric substrate (dielectric constant=3.8) having a thickness of 300 microns. More specifically, with reference to FIG. 3A, a 60 GHz folded dipole antenna (32) was formed having the following dimensions: $W_D$=40 microns, $G_D$=40 microns and $L_D$=1460 microns, for a resonant frequency of about 61.5 GHz. Moreover, for the prototype with the metal (beamshaping) bars (36), the metal bars (36) were formed with dimensions of 5 mm×0.5 mm and placed parallel to the folded dipole (32) on the opposite side of the fused silica substrate (31) about 2 mm away from the dipole (32).

Further, the differential line (33) was formed having LF=¼ wavelength (about 825 microns at 61.5 GHz). The differential line (33) was formed to transform the input impedance of the 60 GHz folded dipole (32) from about 150 Ohms to 100 Ohms. The finite ground coplanar line (34) was designed and dimensioned (line widths and spacing between lines of 75 microns) to provide a characteristic impedance of 100 Ohms to match the input impedance of the antenna (32) as provided by the differential line (33). The balun (35) design was selected to provide a very wide bandwidth over the frequency of operation.

Figure 3B:
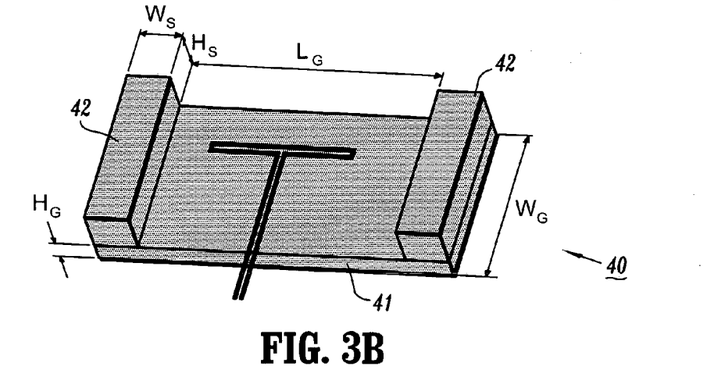
FIG. 3B schematically illustrate a metal bridge structure that was built to provide a ground plane and air cavity for the exemplary prototype antenna device of FIG. 3B.

FIG. 3B schematically illustrates a metal bridge structure (40) that was used in the exemplary prototype antenna design to provide a ground plane and air cavity. The metal bridge structure (40) was formed of copper components including a planar ground plane (41) having dimensions of $W_G$=2 mm, $L_G$=3 mm and $H_G$=250 microns, and side elements (42) having dimensions of $H_S$=500 microns and $W_S$=500 microns. The impedance and radiation pattern of the prototype antenna device was measured using a coplanar probe. More specifically, the substrate (31) was held by a special nonconductive sample holder so that the antenna (32) and feed structure was above the substrate (31) and the copper bridge (40) was placed on the substrate (41) such that the ground plane (41) was disposed over the printed folded dipole antenna (32) and displaced/offset at a distance of $H_S$=500 microns from the substrate (31) via the side elements (42) with an air cavity formed between the substrate (31) and the ground plane (41).

Furthermore, computer simulations were performed for 60 GHz folded dipole antenna designs (with and without the beamshaping bars) as described above using the commercially available HFSS™ application from Ansoft. As is known in the art, HFSS™ is a 3D EM simulation software tool for RF, wireless, packaging, and optoelectronic design. In particular, simulations were performed with the following parameters. More specifically, model antennas were defined for a 60 GHz folded dipole antennas (with and without the metal bars) and a feed network having a structure and dimensions similar to those discussed above with reference to FIG. 3A, and formed on a substrate of fused silica (SiO2) having a thickness of 300 microns with a ground plane disposed 500 microns from the substrate to provide an air cavity between the folded dipole antenna and the ground plane. However, in the computer simulations, the ground plane and substrate were assumed to be infinite, and the dielectric loss (i.e., loss tangent) was assumed to be 0 (since fused silica has a very low loss tangent).

Figure 4:
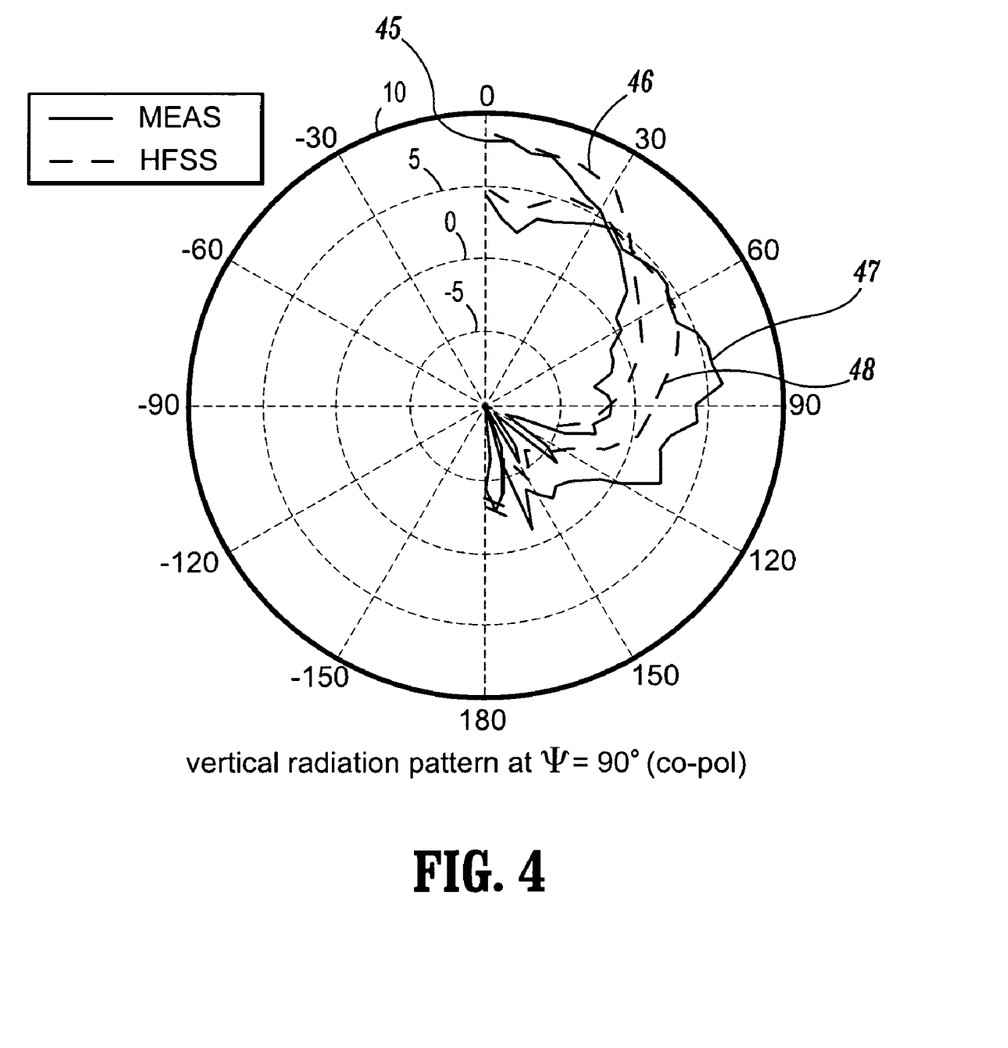
FIG. 4 graphically illustrates vertical radiation patterns that were measured and obtained for 60 GHz antenna devices that were built and simulated based on the framework of FIG. 3A.

FIG. 4 is an exemplary diagram illustrating vertical radiation patterns for a 60 GHz folded dipole antenna device according to the invention. More specifically, FIG. 4 graphically illustrates (using a polar graph) vertical radiation patterns (solid lines) that were measured for the actual antenna prototypes discussed above and the computer simulated vertical radiation patterns (dashed lines) that were obtained using the HFSS simulation tool for the computer modeled antennas discussed above. The vertical radiation patterns depicted in FIG. 4 assume a Cartesian coordinate system having an origin located at point "O" (see FIG. 3A), wherein the Z-axis extends in a direction through the substrate (31) perpendicular to substrate surfaces, wherein the x-axis longitudinally extends along the substrate surface in a direction along axis of the folded dipole (32), and wherein the y-axis longitudinally extends along the substrate surface in a direction perpendicular to the axis of the folded dipole antenna (32).

FIG. 4 the vertical radiation patterns (in polar coordinates) that were measured/obtained in a vertical plane defined by the ZY plane (phi=90 degrees), from 0–180 degrees, wherein 0 degrees represents the positive z direction (which, in FIG. 3A, extends orthoganally away from the surface (S2) of the substrate (31) above the antenna) and 180 degrees represents the negative z direction (which, in FIG. 3A, extends orthoganally away from the surface (S1) of the substrate (31) toward the ground plane). FIG. 4 illustrates (in polar coordinates) (i) the measured vertical radiation pattern (45) (solid line) for the antenna prototype with the metal (beamshaping) bars, (ii) the measured vertical radiation pattern (47) (solid line) for the antenna prototype without the metal (beamshaping) bars, (iii) the vertical radiation pattern (46) (dashed line) obtained for a computer simulation of the exemplary folded dipole antenna with the metal (beamshaping) bars, and (iv) the vertical radiation pattern (48) (dashed line) obtained for a computer simulation of the exemplary folded dipole antenna without the metal (beamshaping) bars.

The vertical radiation patterns depicted in FIG. 4 illustrate good hemispherical radiation patterns with the EM energy radiating mostly in the upper hemisphere (−90 to 90) above the antenna. The measured and simulated radiation patterns (47) and (48) illustrate that for the 60 GHz folded dipole antenna design without the metal (beamshaping) bars, while there is about 5 dB of gain in vertical direction (0 degrees), there is also significant gain in the horizontal direction (90 degrees) parallel to the substrate (31). However, the measured and simulated radiation patterns (45) and (46) illustrate that for the 60 GHz folded dipole antenna designed with the metal bars, there is an increase of about 5 dB of gain in the vertical direction (0 degrees) and a significant decrease of the gain in the horizontal direction (90 degrees). Thus, these results indicate that the metal (beamshaping) bars effectively reduce the horizontal radiation and increase the gain in the desired direction. It is to be appreciated that the exemplary antenna designs are well suited for use as a feed for a reflector as well as for wireless personal area networks with pattern diversity.

Figure 5A:
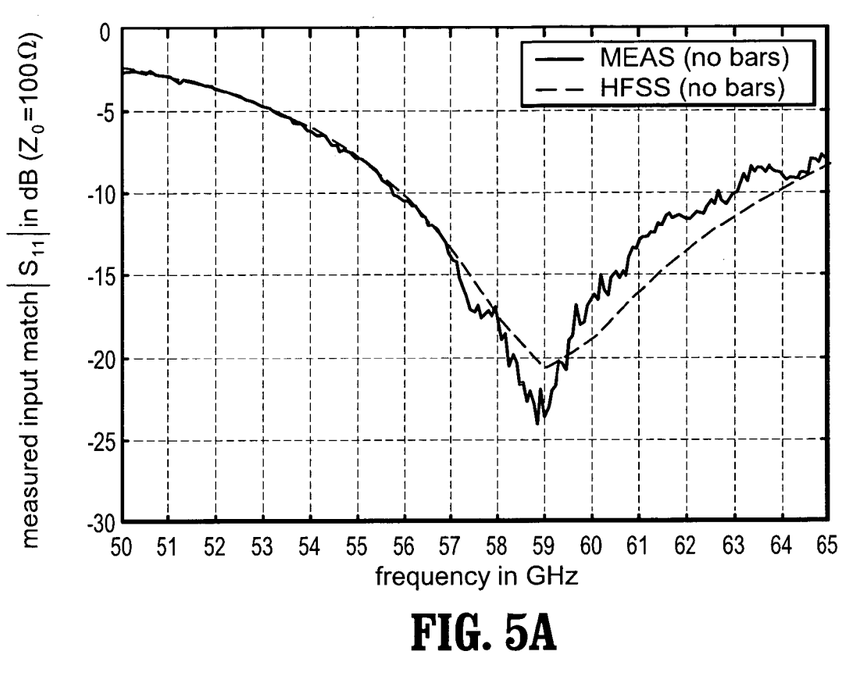
FIGS. 5A and 5B are graphical diagram illustrating impedance match parameters (S11) that were measured and obtained for 60 GHz antenna devices that were built and simulated based on the framework of FIG. 3A.
Figure 5B:
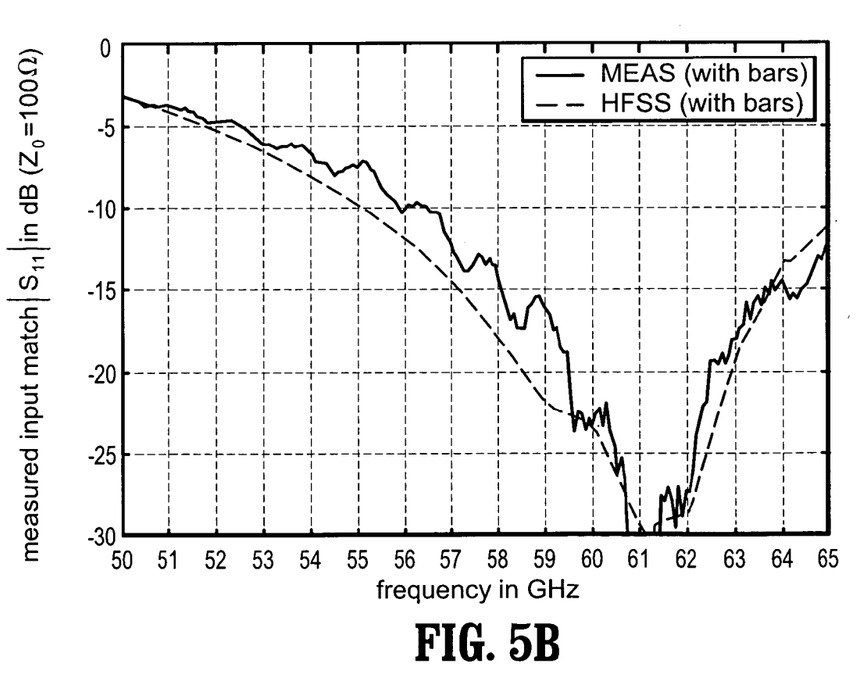

FIGS. 5A and 5B are diagrams that illustrate measured and simulated impedance match parameters (S11) for the exemplary prototype and simulated 60 GHz folded dipole antenna designs with and without the metal bars as described above. In particular, FIG. 5A graphically illustrates a measured (solid line) and simulated (dashed line) input impedance match parameters (S11) in dB for the exemplary prototype and simulated antenna designs, respectively, without the metal (beamshaping) bars. Further, FIG. 5B graphically illustrates the measured (solid line) and simulated (dashed line) input impedance match parameters (S11) in dB for the respective prototype and simulated 60 GHz folded dipole antenna designs with the metal (beamshaping) bars.

The measured/simulated input impedance match ($S_{11}$) graphically shown in FIGS. 5A and 5B, illustrates that the various antenna embodiments provide a wide bandwidth of better than 10% (wherein the bandwidth is defined based on the frequency range for which $S_{11}$ was measured to be about −10 dB or better) over a frequency band of about 57 GHz to about 64 GHz. More specifically, these results indicate that the 60 GHz folded dipole antenna design provides sufficient bandwidth for implementing the exemplary antenna design for ISM band (59–64 GHz) applications.

Those of ordinary skill in the art will readily appreciate that electrical characteristics (e.g., antenna impedance, resonant frequency, bandwidth, efficiency, radiation pattern, etc.) of a printed antenna having an architecture similar to that depicted in FIGS. 2 and 3A, for example, will vary depending on various factors such as the substrate thickness, substrate dielectric constant and air cavity height. In fact, based on the teachings herein, one of ordinary skill in the art of antenna design could readily design and build an antenna having a framework as depicted in FIG. 2 using any suitable printed planar antenna types as depicted in FIGS. 7A–7F, for example, for various applications and for different frequencies of operation.

Figure 6A:
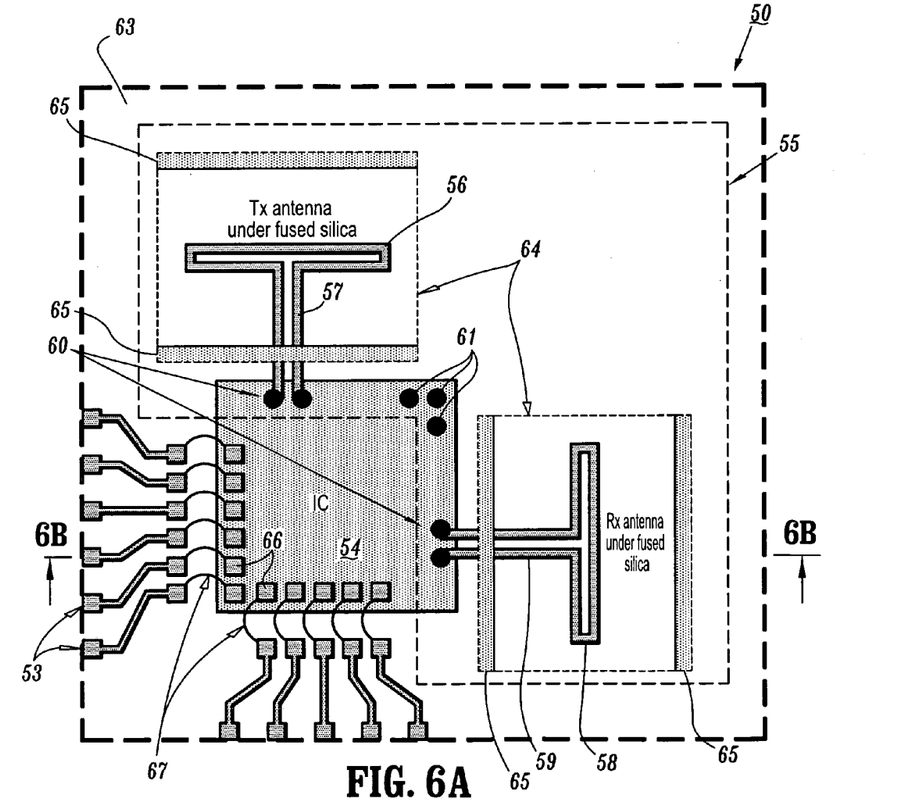
FIGS. 6A and 6B are schematic diagrams illustrating an apparatus for integrally packaging an antenna and IC (integrated circuit) chip, according to an exemplary embodiment of the present invention.
Figure 6B:
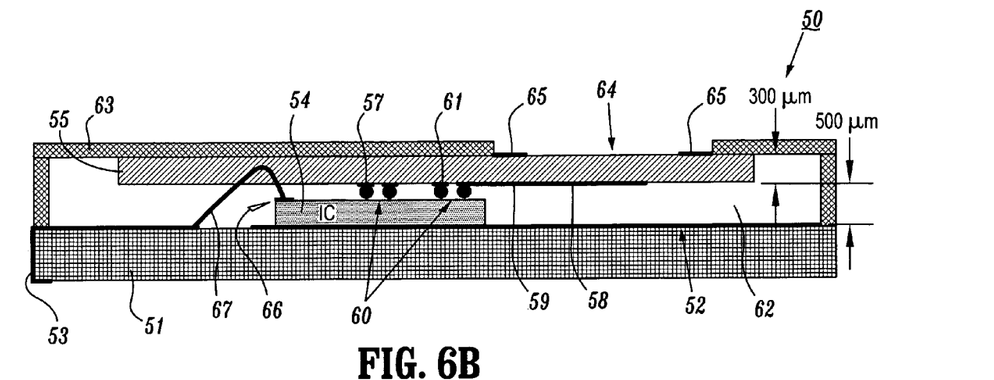

It is to be appreciated that antennas according to exemplary embodiments of the invention can be integrally packaged with IC chips in relatively small packages to construct RF or wireless communications chips. For example, FIGS. 6A and 6B are schematic diagrams illustrating an apparatus for integrally packaging an antenna and IC chip, according to an exemplary embodiment of the present invention. More specifically, FIG. 6A schematically illustrates a plan (top) view of an IC package apparatus (50) and FIG. 6B schematically illustrates a cross-sectional view of the apparatus (50) along the line 6B—6B.

The apparatus (50) comprises a package substrate base (51) having a metallic ground plane (52) and a plurality of package contacts/leads (53) formed thereon. An IC chip (54) (e.g., IC transceiver) is bonded to the package base (51) on the back (non active) surface of the chip (54). The apparatus further comprises a dielectric substrate (55) having a first antenna (56) and feed line (57) pattern and a second antenna (58) and feed line (59) pattern formed on a bottom surface of the substrate (55). In the exemplary embodiment of FIGS. 6A~B, the antennas (56) and (58) and the feed lines (57) and (59) are 60 GHz folded dipole antennas and differential feed lines having frameworks as discussed above with reference to FIG. 3A, which are formed on fused silica substrate that is 300 microns thick. Moreover, in an exemplary embodiment, the first antenna (56) is used for transmitting signals and the second antenna (58) is used for receiving signals.

The substrate (55) is flip-chip bonded to the active surface of the IC chip (54) via a plurality of solder balls (60) and (61). The solder balls (60) provide electrical connections between active components and/or impedance matching structures of the IC chip (54) and the feed lines (57) and (59) for the respective antennas (56) and (58), which provides low loss connection. The solder balls (61) can be used for providing extra mechanical support between the chip (54) and the substrate (55).

Since the antennas (56) and (58) are not located above the chip (54), the ground plane (52) of the package base (51) acts as ground plane for the antennas (56) and (58). In one exemplary embodiment of the invention, the antenna substrate (55) is displaced from the ground plane (52) of the package base (51) by approximately 500 microns to form a cavity (62) (which spacing can be readily obtained given the typical dimensions of the IC chip (54) and the solder balls (60)). The cavity (62) may be an air cavity or the cavity (62) can be filled with a very low dielectric material (usually foam) if desired, which provides additional mechanical support.

The apparatus (50) further comprises a package cover (63) to encapsulate the IC package, which can be formed of a low-cost plastic material. In FIG. 6A, the package cover (63) and dielectric substrate (55) are depicted in phantom (transparent). The package cover (63) is formed with openings (64) to expose portions of the antenna substrate (55) over the antennas (56) and (58). These openings (64) are provided to prevent losses for the antenna radiation. Moreover, in the exemplary embodiment of FIGS. 6A~6B, metal bars (65) are formed on the upper surface of the antenna substrate (55) to optimize the radiation pattern as discussed above. As shown, the cover openings (64) are dimensioned to at least expose the metal bars (65) and the regions of the antenna substrate (55) between the bars (65).

Furthermore, the IC chip (54) comprises a plurality of contact pads (66) on the active surface of the chip (54) for making electrical connections (e.g., ground, power, I/O) between the IC chip (54) and the package contacts/leads (53) via bond wires (67). As depicted in FIG. 6A, the antenna substrate (55) is formed into an L-shape to provide an area on the IC chip (54) to connect all other I/O signals via bond wires (67) to the package leads (53). Further, the transmitting antenna (56) and receiving antenna (58) are disposed orthogonal to each other which minimizes mutual coupling.

In other exemplary embodiments of the invention, the apparatus (50) may comprise an impedance matching network for matching the impedances of the antennas and a device/circuit (e.g., power amplifier) on the IC chip (54). For example, in one exemplary embodiment, an impedance matching network (e.g., a transmission line) may be integrally formed on the IC chip (54). For example, in the exemplary embodiment of FIGS. 6A~B, as depicted in FIG. 3A, the solder balls (60) can be bonded to one end of an impedance matching network such as a balun connected to a coplanar transmission line formed on the IC chip (54), provide the inductive/capacitive impedance matching between the antenna and a device/component (e.g., power amplifier, LNA, etc.) connected to the other end of the impedance It is to be understood that the exemplary embodiments discussed above with reference to FIGS. 3A and 6A–B, for example, are merely exemplary embodiments of antennas and IC packages according to the invention, and that one of ordinary skill in the art can readily envision other antenna types that can be constructed and packaged with IC chips using the devices and methods of the present invention. For example, an antenna that is designed having the general framework depicted in FIG. 2 can be formed using patch antennas.

Moreover, any suitable high-frequency antenna (e.g., about 20 GHz or greater) that is constructed in accordance with the teachings of the present invention can be used for constructing an integrated communications chip, and that the 60 GHz folded dipole antennas discussed above and depicted in FIGS. 3A and 6A–B are merely one exemplary embodiment of the invention for implementing an IC package device. Further, although two separate antennas are depicted in FIGS. 6A and 6B, IC packages according to other exemplary embodiments of the invention may be readily envisioned whereby one antenna is used for both transmitting and receiving for an integrated antenna and transceiver chip package design. Moreover, in other exemplary embodiments, the IC chip (54) depicted in FIGS. 6A–B may comprise an integrated transceiver chip, an integrated receiver chip, an integrated transmitter chip, etc., and/or other IC chips comprising necessary support circuitry for implementing a communications chip package.

Those of ordinary skill in the art will readily appreciate the various advantages associated with antennas and integrated antenna packages according to embodiments of the invention. For instance, exemplary antenna designs which comprise printed antennas on substrates enable high-volume antenna manufacturing capability. Moreover, integrated IC packages according to exemplary embodiments of the invention enable antennas to be integrally packaged with IC chips such as transceiver chips, which provide compact designs with very low loss between the transceiver and the antenna. Indeed, the relatively small ground plane required for the exemplary antenna designs enable very compact packaging. In addition, such IC package designs eliminate the need to go off the transceiver chip with high frequency input and output signals, thereby providing low loss designs.

Another advantage is that printed antenna designs and IC packages with such antennas provide radiation patterns that are very suitable to be placed in the center of a focusing antenna for directional antenna applications like point to point systems or radar systems. Indeed, antennas and integrated antenna packages according to the present invention enable a multitude of applications such as integrated phased array antenna systems, personal area networks, radar feeds, high reliability due to redundancy, point-to-point systems, etc. Moreover, the use of integrated antenna/IC chip packages according to the present invention saves significant space, size, cost and weight, which is a premium for virtually any commercial or military application.

Furthermore, in other exemplary embodiments of the invention, antennas can be constructed having an array of two or more printed antenna formed on a substrate to provide an antenna with desired directivity for beamforming or beamsteering antenna applications. In general, a directive antenna beam pattern can be obtained using a phased array antenna, wherein the input signal phase to each printed antenna is controlled to electronically scan or steer the directive antenna pattern to a desired direction. It could also be placed in the center of a focusing antenna for directional antenna applications such as point-to-point systems or radar systems. Furthermore, it is to be appreciated that antenna designs according to exemplary embodiments of the invention can be implemented not only for MMW applications, but may also be used at lower frequencies.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

What is claimed is:

1. An IC (integrated circuit) package device, comprising:
   a package substrate having a ground plane formed on a surface thereof;
   an IC chip bonded to the surface of the package substrate;
   a planar substrate comprising an antenna pattern formed on a first surface of the planar substrate, wherein the planar substrate is flip-chip bonded to the IC chip such that the antenna pattern faces toward the ground plane of the package substrate and the first surface of the planar substrate is disposed substantially parallel to, and displaced from, the ground plane of the package substrate; and
   a package cover formed over the package base substrate to encapsulate the IC chip and planar substrate, wherein the package cover comprises an opening that exposes a portion of a second surface of the planar substrate opposite a portion of the first surface of the planar substrate having the antenna pattern.

2. The device of claim 1, wherein a space between the ground plane and planar substrate is filled with air.

3. The device of claim 1, wherein a space between the ground plane and planar substrate is filled with foam.

4. The device of claim 1, further comprising a antenna feed network formed on the first surface of the planar substrate, wherein the feed network is connected to contacts on the IC chip using solder balls.

5. The device of claim 4, wherein the antenna feed network comprises an impedance matching network.

6. The device of claim 1, wherein the antenna has a resonant frequency of about 20 GHz or greater.

7. The device of claim 1, wherein the antenna pattern is a folded dipole antenna or a dipole antenna.

8. The device of claim 1, wherein the antenna pattern is a patch antenna.

9. The device of claim 1, further comprising a beamshaping pattern formed on one of the first surface of the planar substrate, the exposed portion of the second surface of the planar substrate, and both the first surface and the exposed portion of the second surface of the planar substrate, to reduce radiation in a direction along the plane of the planar substrate.

10. The device of claim 1, further comprising a beamshaping pattern formed on one of the first surface of the planar substrate, the exposed portion of the second surface of the planar substrate, and both the first surface and the exposed portion of the second surface of the planar substrate, to enhance a vertical radiation in a hemisphere above the second surface of the planar substrate.

11. The antenna of claim 9, wherein the antenna pattern comprises a folded dipole antenna or a dipole antenna, and wherein the beamshaping pattern comprises first and second metal strips that extend parallel to a longitudinal axis of the folded dipole.

12. The device of claim 1, wherein the IC chip comprises a transceiver, a receiver, or a transmitter.

* * * * *